(12) United States Patent
Kang

(10) Patent No.: US 8,139,423 B2
(45) Date of Patent: Mar. 20, 2012

(54) WRITE DRIVING DEVICE

(75) Inventor: Tae Jin Kang, Suwon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/939,614

(22) Filed: Nov. 4, 2010

(65) Prior Publication Data

US 2011/0128049 A1 Jun. 2, 2011

(30) Foreign Application Priority Data

Nov. 30, 2009 (KR) ........................ 10-2009-0117113

(51) Int. Cl.
*G11C 7/06* (2006.01)
(52) U.S. Cl. .......... 365/189.07; 365/185.23; 365/230.06
(58) Field of Classification Search ............. 365/185.23, 365/189.07, 230.06
See application file for complete search history.

(56) References Cited

U.S. PATENT DOCUMENTS

| 7,068,549 | B2 * | 6/2006 | Cho | ............................. 365/193 |
| 7,532,530 | B2 | 5/2009 | Kim | |
| 7,660,176 | B2 | 2/2010 | Hur | |

FOREIGN PATENT DOCUMENTS

KR 100832030 B1 5/2008
* cited by examiner

*Primary Examiner* — Jason Lappas
(74) *Attorney, Agent, or Firm* — William Park & Associates Ltd.

(57) ABSTRACT

A write driving device includes a buffer unit, a duration signal generation unit, and a data input clock pulse generation unit. The buffer unit is configured to generate an alignment signal in response to a transition timing of a data strobe signal. The duration signal generation unit is configured to generate a duration signal which is enabled during a predetermined duration in response to a write command. The data input clock pulse generation unit is configured to generate a data input clock pulse for transferring data to a global line in response to the alignment signal within an enable duration of the duration signal.

16 Claims, 11 Drawing Sheets

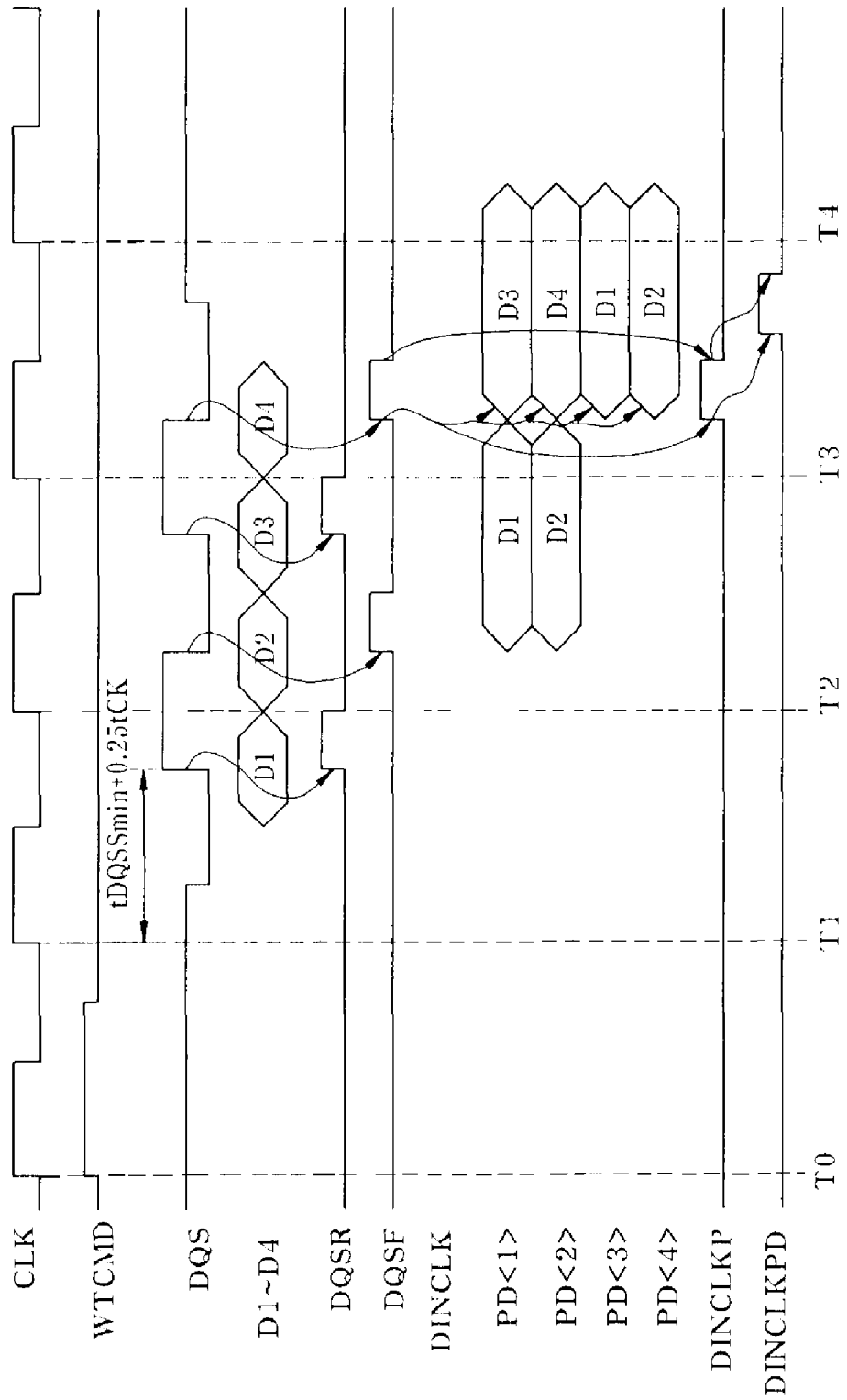

WRITE DRIVING DEVICE

CROSS-REFERENCES TO RELATED APPLICATIONS

The present application claims priority under 35 U.S.C 119(a) to Korean application number 10-2009-0117113, filed on Nov. 30, 2009, in the Korean intellectual property Office, which is incorporated herein by reference in its entirety.

BACKGROUND

A semiconductor memory device receives a data strobe signal as well as data from a memory controller. The data strobe signal synchronizes the semiconductor memory device to the memory controller upon receiving data so as to ensure safe data transfer. The semiconductor memory device stores the received data in a memory cell by using a write driving device.

FIG. 1 shows a conventional write driving device.

In FIG. 1, the conventional write driving device includes a data input clock generation unit 1, a data alignment unit 2, and a driving unit 3.

When a write command WTCMD is inputted, the data input clock generation unit 1 generates a data input clock DINCLK which is enabled at a preset timing of a clock. The data alignment unit 2 receives data D1 to D4 serially inputted in response to a transition timing of a data strobe signal DQS to align the received data D1 to D4 in parallel and outputs parallel data PD<1:4>. The driving unit 3 outputs the parallel data PD<1:4> as global line data GIOD<1:4> in response to the data input clock DINCLK.

The operation of the conventional write driving device will be described below with reference to FIGS. 2-3.

FIGS. 2-3 are timing diagrams illustrating the operation of the write driving device of FIG. 1, based on a minimum input timing and a maximum input timing of the data strobe signal, which are defined in the Joint Electron Device Engineering Council (JEDEC). For purposes of illustration, a write latency is 1 is assumed.

Referring to FIG. 2, when the write command WTCMD is inputted at time T0 of the clock CLK, the data strobe signal DQS is inputted after 0.75tCK from time T1 of the clock CLK. The input of the data strobe signal DQS after 0.75tCK from time T1 of the clock CLK is referred to as a minimum input timing tDQSSmin of the data strobe signal DQS. When the data strobe signal DQS is inputted, the data alignment unit 2: receives the data D1 to D4 in response to the transition of the data strobe signal DQS; parallelizes the data D1 to D4 at a timing when the reception of the data D1 to D4 is completed; and outputs the parallel data PD<1:4>. The data input clock generation unit 1 generates the data input clock DINCLKP, which is enabled to a high level at a preset timing after the input timing of the write command TWCMD, that is, during a duration TA. The driving unit 3 outputs the parallel data PD<1:4> as the global line data GIOD<1:4> in response to the data input clock DINCLKP.

Referring to FIG. 3, the data strobe signal DQS is inputted after 1.25tCK from time T1 of the clock CLK when the write command WTCMD is inputted at time T0 of the clock CLK. The input of the data strobe signal DQS after 1.25tCK from time T1 of the clock CLK is referred to as a maximum input timing tDQSSmax of the data strobe signal DQS. When the data strobe signal DQS is inputted, the data alignment unit 2: receives the data D1 to D4 in response to the transition of the data strobe signal DQS; parallelizes the data D1 to D4 at a timing when the reception of the data D1 to D4 is completed; and outputs the parallel data PD<1:4>. The data input clock generation unit 1 generates the data input clock DINCLKP, which is enabled to a high level at a preset timing after the input timing of the write command WTCMD, that is, during a duration TA. The driving unit 3 outputs the parallel data PD<1:4> as the global line data GIOD<1:4> in response to the data input clock DINCLKP.

Comparing FIGS. 2 and 3, the timing of generating the parallel data PD<1:4> is varied depending on the input timing of the data strobe signal DQS, whereas the output timing of the parallel data PD<1:4> to the global line data GIOD<1:4>, that is, the timing of generating the data input clock DINCLKP, does not vary. This occurs because it is specified that the data input clock DINCLKP should be enabled at an assigned timing. So long as the data strobe signal DQS is inputted within the range of the minimum input timing tDQSSmin and the maximum input timing tDQSSmax, the margin for allowing the parallel data PD<1:4> to be outputted as the global line data GIOD<1:4> is ideally ensured even though the generation timing of the data input clock DINCLKP did not vary.

However, even if the data strobe signal DQS is commanded to be inputted within the minimum and maximum input timings tDQSSmin, tDQSSmax, the actual input of the data strobe signal DQS may still experience a delay due to the internal environment factors of the semiconductor memory device, e.g., voltage, temperature, loading, etc. Then, the data D1 to D4 delayed by the additional delay time of the data strobe signal DQS will be inputted when there were an additional delay in the data strobe signal DQS due to the undesirable factors. Consequently, the generation timing of the parallel data PD<1:4> will also be delayed additionally.

For example, now referring to FIG. 4, when the data strobe signal DQS were to be inputted at the maximum input timing tDQSSmax but was delayed by $\alpha$tCK due to the internal environment factors, the delayed data strobe signal DQSD will delay the input timing of the data D1 to D4 that will in turn delay the generation timing of the parallel data PD<1:4>. Since the data input clock DINCLKP would be enabled during the assigned duration TA, which does not vary regardless of the delayed input timing of the data D1 to D4, the margin for outputting the parallel data PD<1:4> as the global line data GIOD<1:4> will then become insufficient. The parallel data PD<1:4> then will not completely transfer to the global lines. This problem will only get more serious as the bit number of data for transfer increases.

In addition, the external environment factors (e.g., temperature, voltage, loading, etc.) will also cause the problems of delay as described above as the frequency of the semiconductor device increases and the operating voltage decreases, and such phenomenon may occur when the data strobe signal DQS outputted from the memory controller is not inputted between the minimum input timing tDQSSmin and the maximum input timing tDQSSmax.

SUMMARY

An embodiment of the present invention relates to a write driving device which is capable of ensuring a parallel data transfer margin by changing an enable timing of a data input clock pulse.

In an embodiment, a write driving device includes: a buffer unit configured to generate an alignment signal in response to a transition timing of a data strobe signal; a duration signal generation unit configured to generate a duration signal which is enabled during a predetermined duration in response to a write command; and a data input clock pulse generation unit configured to generate a data input clock pulse for transferring data to a global line in response to the alignment signal within an enable duration of the duration signal.

In addition, a write driving device increases: a buffer unit configured to generate first and second alignment signals in response to a transition of a data strobe signal; a duration signal generation unit configured to generate a duration signal which is enabled during a predetermined duration in response to a write command; a data input clock pulse generation unit configured to generate a data input clock pulse in response to the second alignment signal within an enable duration of the duration signal; a data alignment unit configured to parallelize data according to the first and second alignment signals and output parallel data; and a driving unit configured to output the parallel data in response to the data input clock pulse.

BRIEF DESCRIPTION OF THE DRAWINGS

The above and other aspects, features and other advantages will be more clearly understood from the following detailed description taken in conjunction with the accompanying drawings, in which:

FIG. 12 is a timing diagram illustrating a case in which the data strobe signal is inputted earlier than the minimum input timing by αtCK due to external environment factors.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
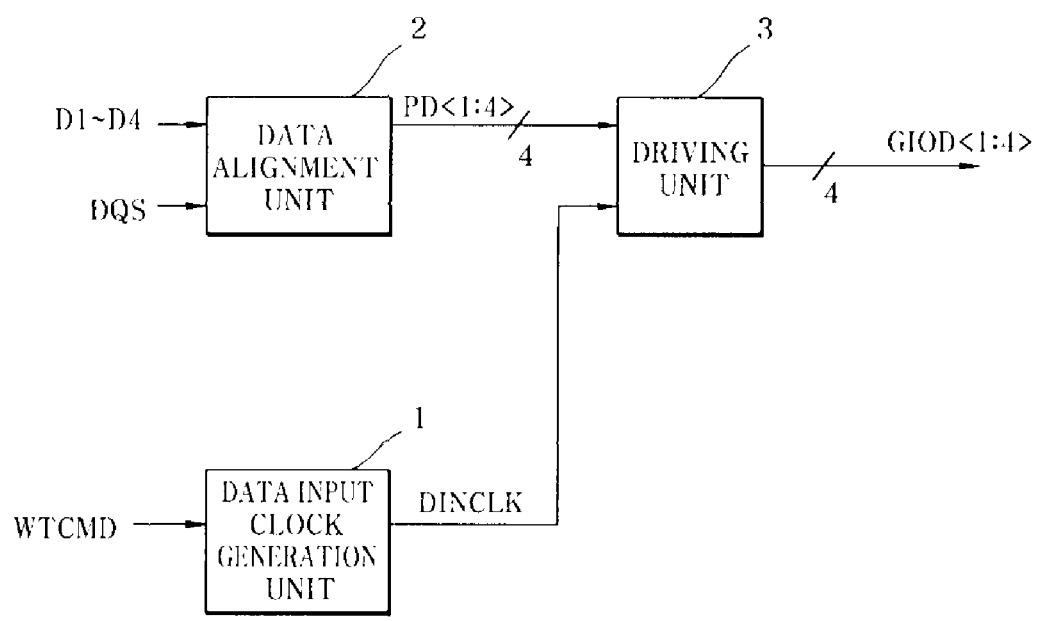
FIG. 1 is a block diagram illustrating a conventional write driving device.
Figure 2:
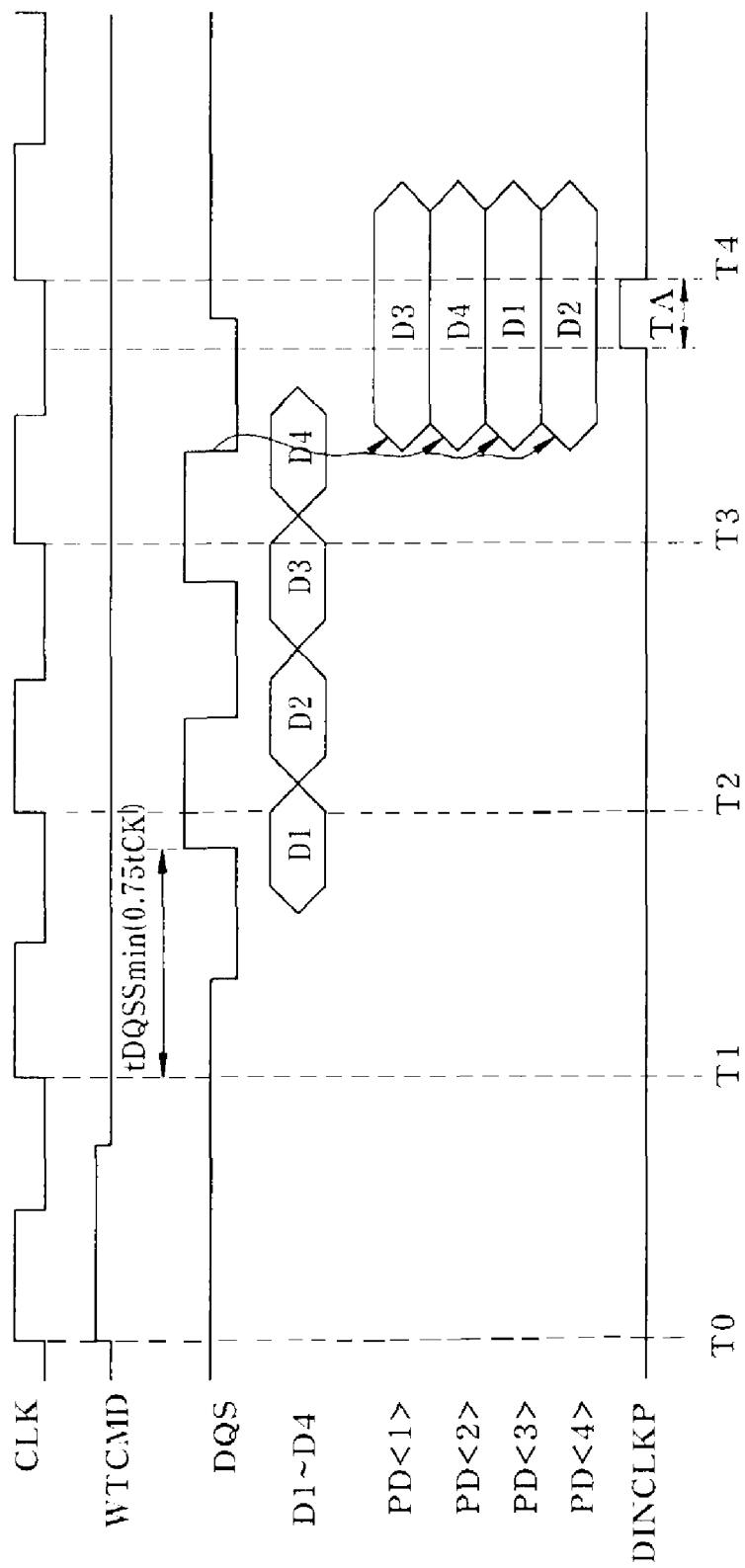
FIGS. 2 and 3 are timing diagrams illustrating the operation of the conventional write driving device of FIG. 1 based on a minimum input timing and a maximum input timing of a data strobe signal, which are defined in the Joint Electron Device Engineering Council (JEDEC)
Figure 3:
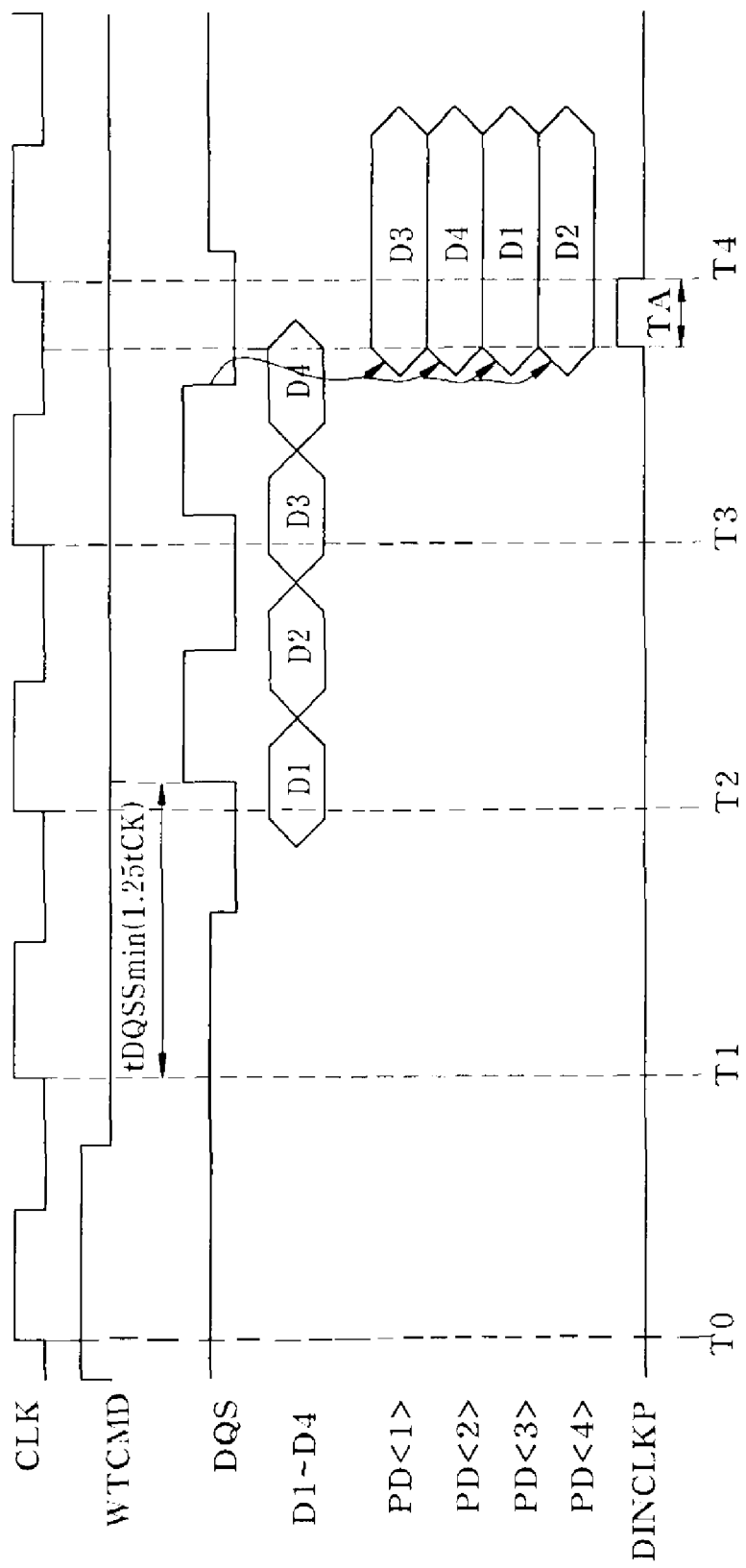
Figure 4:
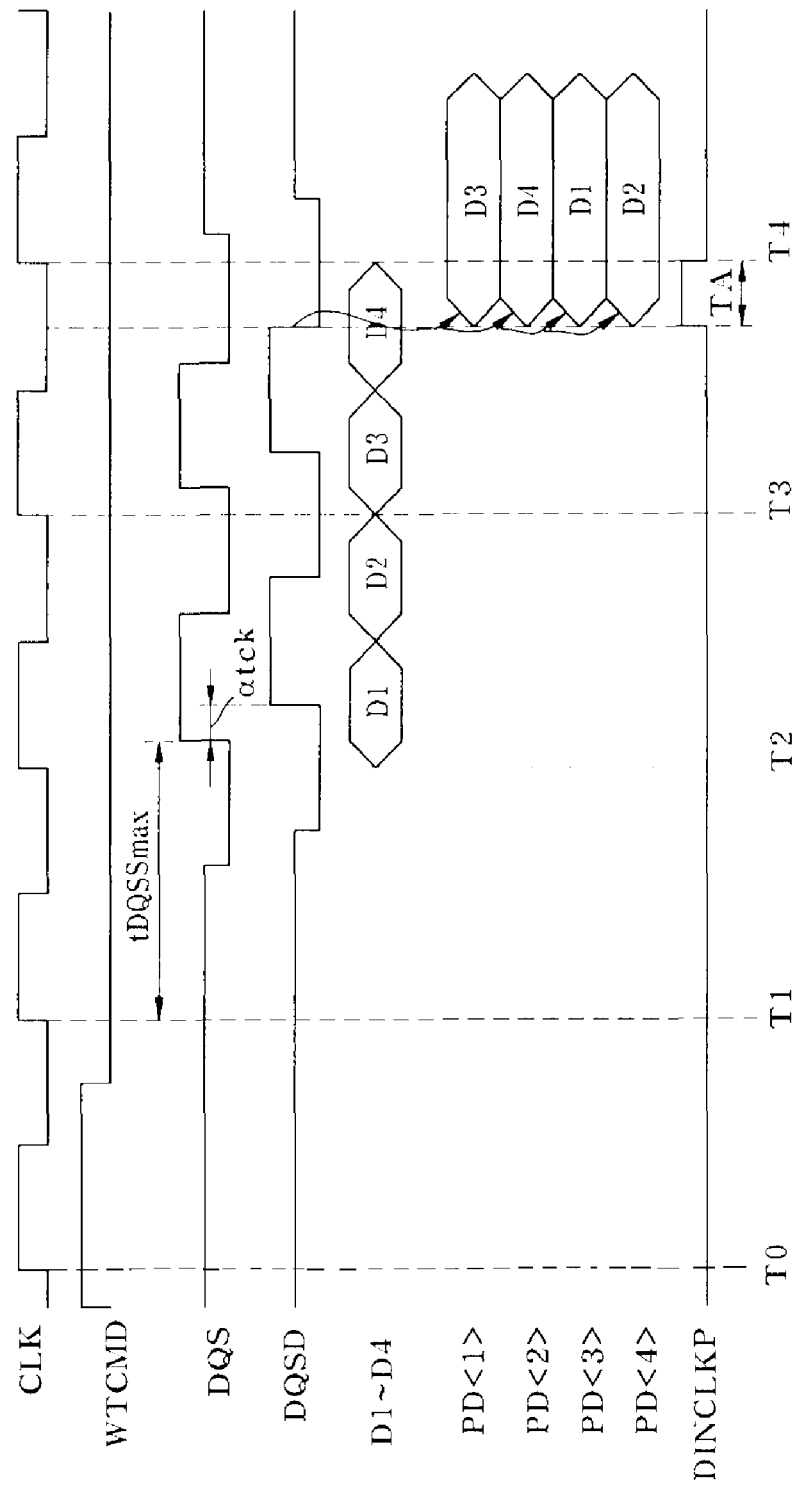
FIG. 4 is a timing diagram illustrating the operation of the conventional write driving device of FIG. 1 when the data strobe signal is delayed due to internal environment factors.
Figure 5:
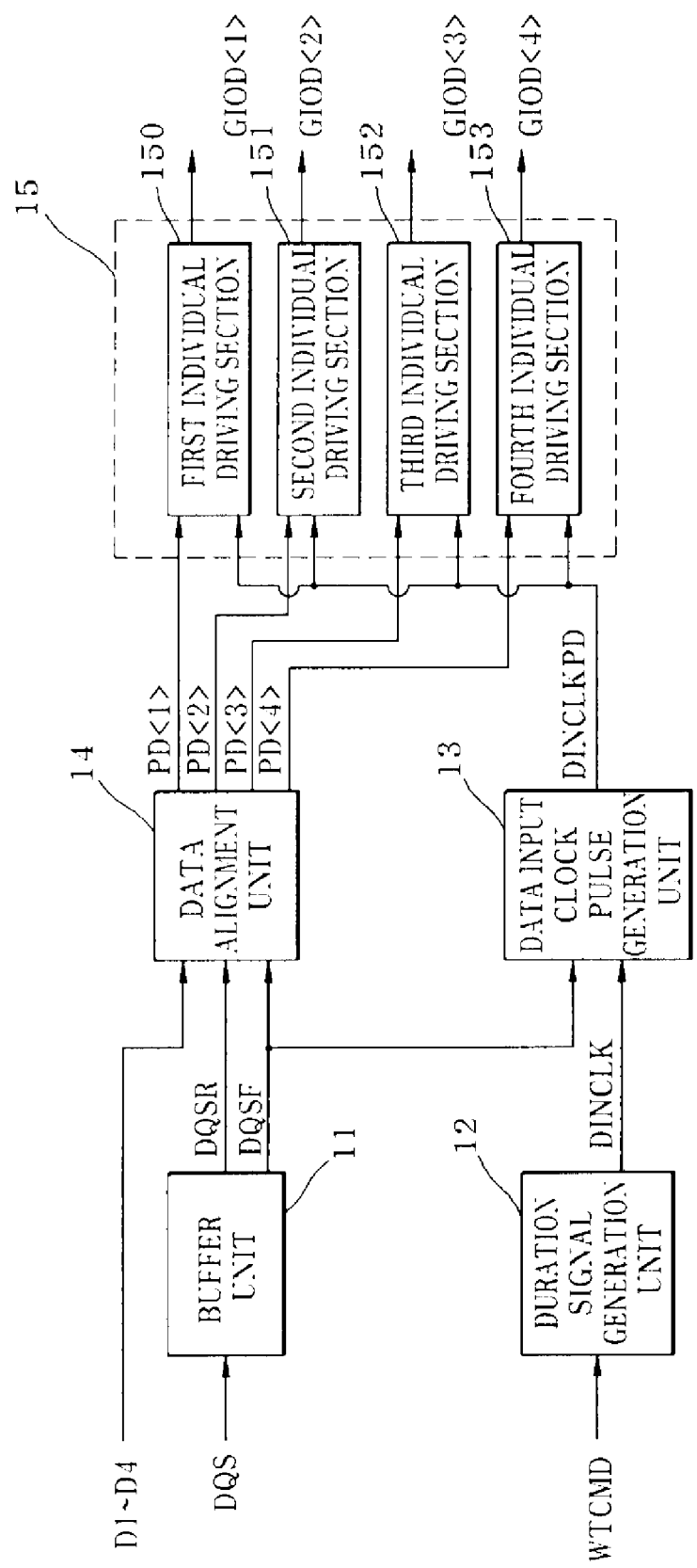
FIG. 5 is a block diagram illustrating a write driving device according to an embodiment of the present invention.

FIG. 5 is a block diagram illustrating a write driving device according to an embodiment of the present invention.

Referring to FIG. 5, the write driving device includes a buffer unit 11, a duration signal generation unit 12, a data input clock pulse generation unit 13, a data alignment unit 14, and a driving unit 15.

Figure 6:
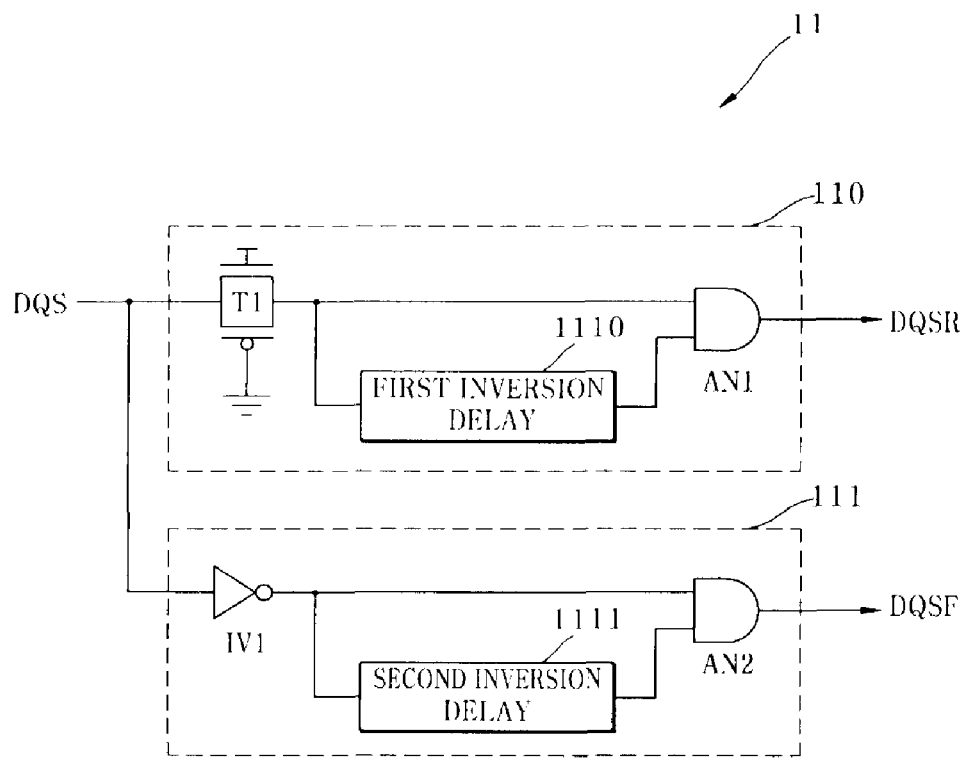
FIG. 6 is a circuit diagram illustrating a buffer unit of FIG. 5.

As illustrated in FIG. 6, the buffer unit 11 includes a first pulse generation section 110 and a second pulse generation section 111. Specifically, the first pulse generation section 110 includes a first transfer gate T1 configured to transfer a data strobe signal DQS, a first inversion delay 1100 configured to invert and delay an output signal of the first transfer gate T1, and a first AND gate AN1 configured to perform an AND operation on the output signal of the first transfer gate T1 and an output signal of the first inversion delay 1100 and output a first alignment signal DQSR. The second pulse generation section 111 includes a first inverter IV1 configured to invert the data strobe signal DQS, a second inversion delay 1111 configured to invert and delay an output signal of the first inverter IV1, and a second AND gate AN2 configured to perform an AND operation on the output signal of the first inverter IV1 and an output signal of the second inversion delay 1111 and output a second alignment signal DQSF. The first transfer gate T1 of the first pulse generation section 110 is provided so as to apply an equal amount of delay which would be caused by the first inverter IV1 to the data strobe signal DQS of the first pulse generation section 110.

The buffer unit 11 configured as above generates the first alignment signal DQSR being a pulse signal in response to a rising timing of the data strobe signal DQS, and generates the second alignment signal DQSF being a pulse signal in response to a falling timing of the data strobe signal DQS. The enable duration of the first alignment signal DQSR is determined by the delay duration of the first inversion delay 1110, and the enable duration of the second alignment signal DQSF is determined by the delay duration of the second inversion delay 1111.

Figure 7:
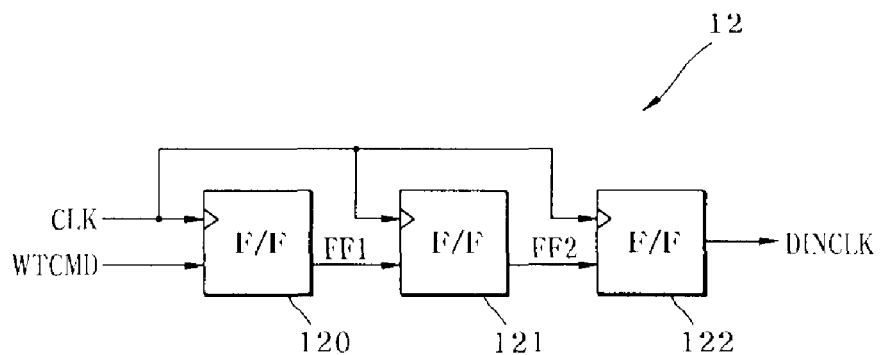
FIG. 7 is a circuit diagram illustrating a duration signal generation unit of FIG. 5.

As illustrated in FIG. 7, the duration signal generation unit 12 includes first to third flip-flops 120 to 122. The first flip-flop 120 is configured to receive a write command WTCMD and output a first flip-flop signal FF1 in synchronization with a clock CLK. The second flip-flop 121 is configured to receive the first flip-flop signal FF1 and output a second flip-flop signal FF2 in synchronization with the clock CLK. The third flip-flop 122 is configured to receive the second flip-flop signal FF2 and output a duration signal DINCLK in synchronization with the clock CLK. The configuration in which the duration signal generation unit 12 is provided with the first to third flip-flops 120 to 122 is merely exemplary. The duration signal generation unit 12 may have any configuration to accomplish that the write command WTCMD can be shifted to the extent that an overlap margin between the duration signal DINCLK and the second alignment signal DQSF can be sufficiently ensured.

In this embodiment, the duration signal generation unit 12 includes three flip-flops 120 to 122 synchronized with the clock CLK. When the write command WTCMD is inputted, the duration signal generation unit 12 generates the duration signal DINCLK having an enable duration of 1tCK after 3tCK of the clock CLK.

Figure 8:
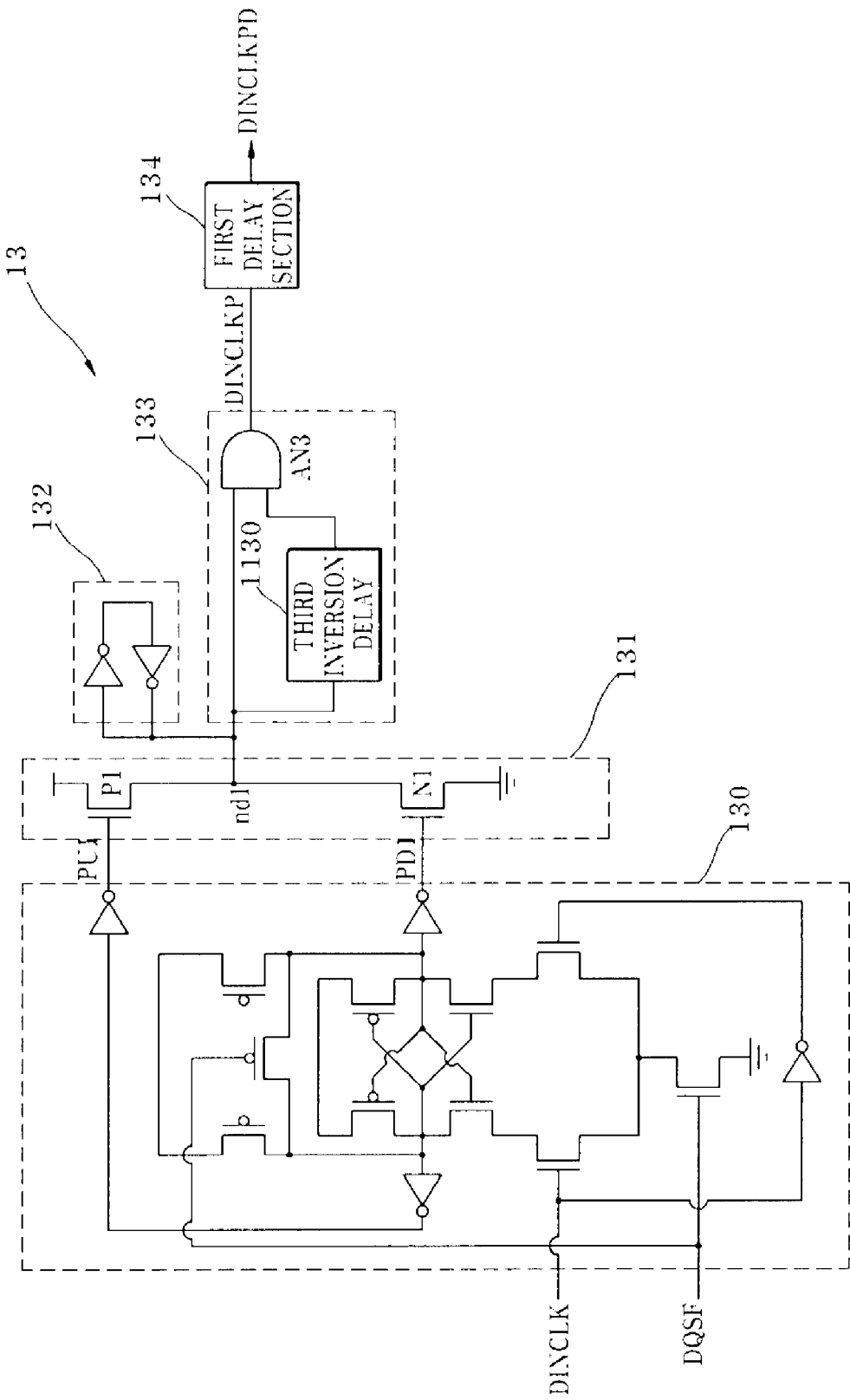
FIG. 8 is a circuit diagram illustrating a data input clock pulse generation unit of FIG. 5.

As illustrated in FIG. 8, the data input clock pulse generation unit 13 includes a first cross-coupled latch section 130, a first driving section 131, a first latch section 132, a third pulse generation section 133, and a first delay section 134. Specifically, the first cross-coupled latch section 130 is configured with a typical cross-coupled latch, which receives the duration signal DINCLK and the second alignment signal DQSF and outputs a first pull-up signal PU1 and a first pull-down signal PD1. The first driving section 131 includes a first PMOS transistor P1 configured to operate as a pull-up element which pulls up a first node nd1 in response to the first pull-up signal PU1, and a first NMOS transistor N1 configured to operate as a pull-down element which pulls down the first node nd1 in response to the pull-down signal PD1. The first latch section 132 is configured with an inverter-type latch, and latches a signal of the first node nd1. The third pulse generation section 133 includes a third inversion delay 1130 configured to invert and delay the signal of the first node nd1, and a third AND gate AN3 configured to perform an AND operation on the output signal of the first node nd1 and an output signal of the third inversion delay 1130 and output an initial data input clock pulse DINCLKP. The first delay section 134 delays the initial data input clock pulse DINCLKP and output a data input clock DINCLKPD. Alternatively, the first delay section 134 may be omitted, because it can be replaced with a delay corresponding to the distance difference between the data input clock pulse generation unit 13 and the data driving unit 15.

The first cross-coupled latch section 130 of the data input clock pulse generation unit 13 as configured as above enables the first pull-up signal PU1 to a low level and disables the first pull-down signal PD1 to a low level when the duration signal DINCLK becomes a high level in a duration in which the second alignment signal DQSF is enabled to a high level. When the first pull-up signal PU1 and the first pull-down signal PD1 become a low level, the first driving section 131 drives the first node nd1 to a high level. When the first node nd1 becomes a high level, the third pulse generation section 133 generates the initial data input clock pulse DINCLKP which is enabled to a high level at a timing in which the first node nd1 becomes a high level, and disabled to a low level after a delay amount of the third inversion delay 1130. Subsequently, the first delay section 134 delays the initial data input clock pulse DINCLKP and outputs the data input clock pulse DINCLKPD.

Figure 9:
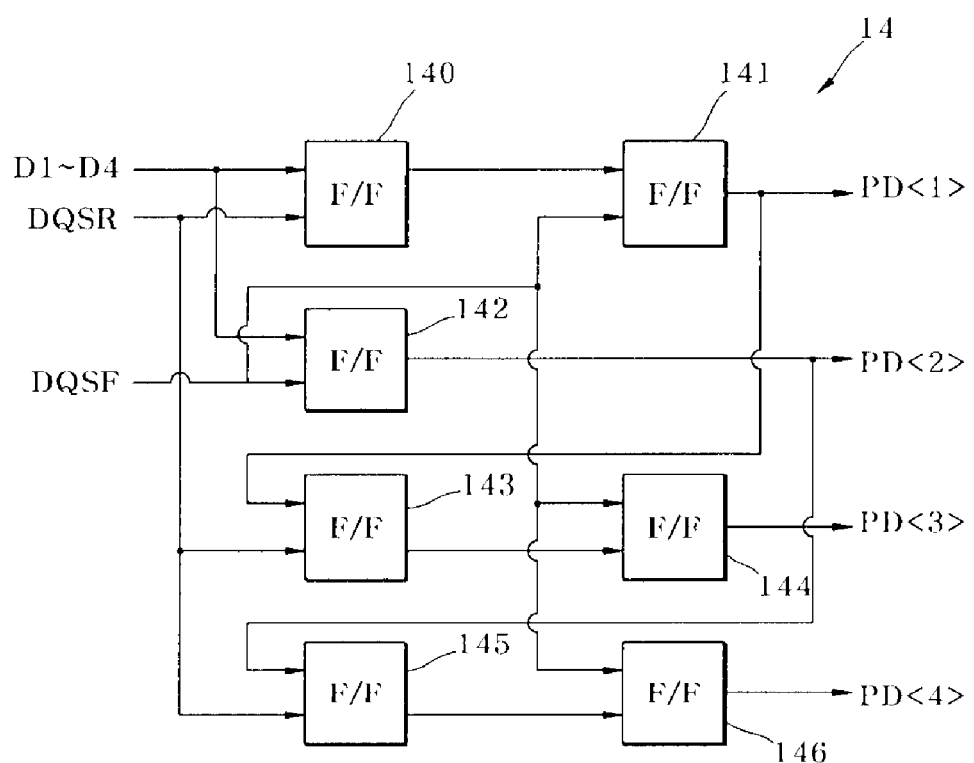
FIG. 9 is a circuit diagram illustrating a data alignment unit of FIG. 5.

As illustrated in FIG. 9, the data alignment unit 14 includes a first flip-flop 140, a second flip-flop 141, a third flip-flop 142, a fourth flip-flop 143, a fifth flip-flop 144, a sixth flip-flop 145, and a seventh flip-flop 146. The first flip-flop 140 is configured to transfer the first and third data D1, D3 in response to the first alignment signal DQSR. The second flip-flop 141 is configured to transfer the first data D1 of the first and third data D1, D3 from the first flip-flop 140 to the fourth flip-flop 143 and output the third data D3 as the first parallel data PD<1> in response to the second alignment signal DQSF. The third flip-flop 142 is configured to transfer the second and fourth data D2, D4 in response to the first alignment signal DQSR. The third flip-flop 142 is configured to transfer the second data D2 to the sixth flip-flop 145 and output the fourth data D4 as the second parallel data PD<2> in response to the second alignment signal DQSF. The fourth flip-flop 143 is configured to output the first data D1, which is transferred from the second flop-flop 141, in response to the first alignment signal DQSR. The fifth flip-flop 144 is configured to output the first data D1, which is transferred from the fourth flip-flop 143, as the third parallel data PD<3> in response to the second alignment signal DQSF. The sixth flip-flop 145 is configured to output the second data D2, which is transferred from the third flip-flop 142 in response to the first alignment signal DQSR. The seventh flip-flop 146 is configured to output the second data D2, which is transferred from the sixth flip-flop 145, as the fourth parallel data PD<4> in response to the second alignment signal DQSF.

The data alignment unit 14 configured as above outputs the third data D3 as the first parallel data PD<1>, the fourth data D4 as the second parallel data PD<2>, the first data D1 as the third parallel data PD<3>, and the second data D2 as the fourth parallel data PD<4>. The first to fourth parallel data PD<1:4> are then outputted in response to the second rising timing of the second alignment signal DQSF.

Now referring back to FIG. 5, the driving unit 15 includes first to fourth individual driving sections 150 to 153 configured to output the first to fourth parallel data PD<1:4> in response to the data input clock pulse DINCLKPD. Since the first to fourth individual driving sections 150 to 153 are designed in the same circuit configuration, except that different parallel data are inputted thereto, only the first individual driving section 150 will be described below.

Figure 10:
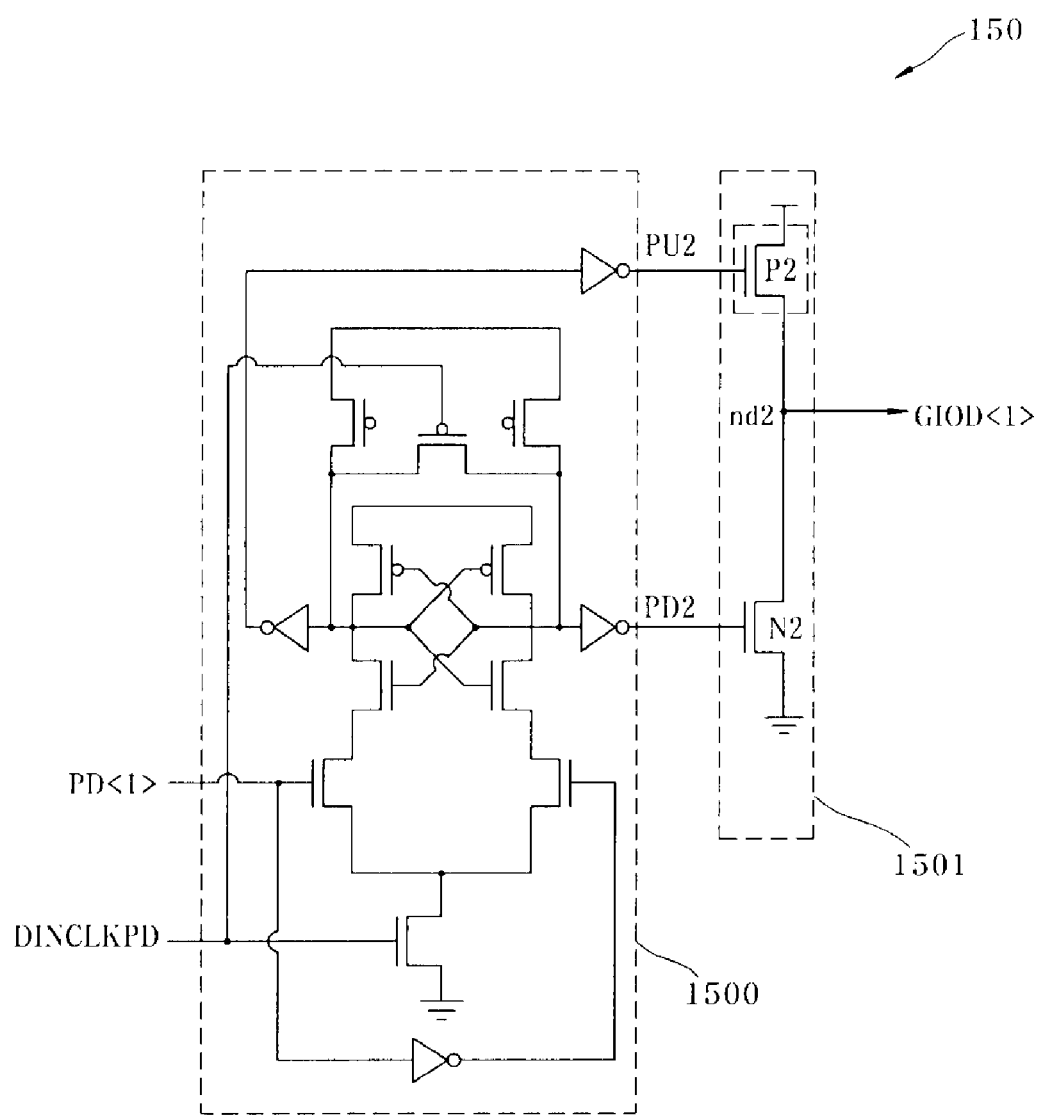
FIG. 10 is a circuit diagram illustrating a first individual driving section of FIG. 5.

As illustrated in FIG. 10, the first individual driving section 150 includes a second cross-coupled latch section 1500 and a second driving section 1501. The second cross-coupled latch section 1500 is configured with a typical cross-coupled latch, which receives the data input clock pulse DINCLKPD and the first parallel data PD<1> and outputs a second pull-up signal PU2 and a second pull-down signal PD2. The second driving section 1501 includes a second PMOS transistor P2 configured to operate as a pull-up element which pulls up a second node nd2 in response to the second pull-up signal PU2, and a second NMOS transistor N2 configured to operate as a pull-down element which pulls down the second node nd2 in response to the second pull-down signal PD2.

The second cross-coupled latch section 1500 of the first individual driving section 150 as configured as above enables the second pull-up signal PU2 to a low level and disables the second pull-down signal PD2 to a low level when the first parallel data PD<1> is enabled to a high level in a duration in which the data input clock pulse DINCLKPD is enabled to a high level. When the second pull-up signal PU2 and the second pull-down signal PD2 become a low level, the second driving section 1501 drives the second node nd2 to a high level and outputs the first global line data GIOD<1>.

The operation of the write driving device configured as above will be described below with reference to FIGS. 11 and 12.

Figure 11:
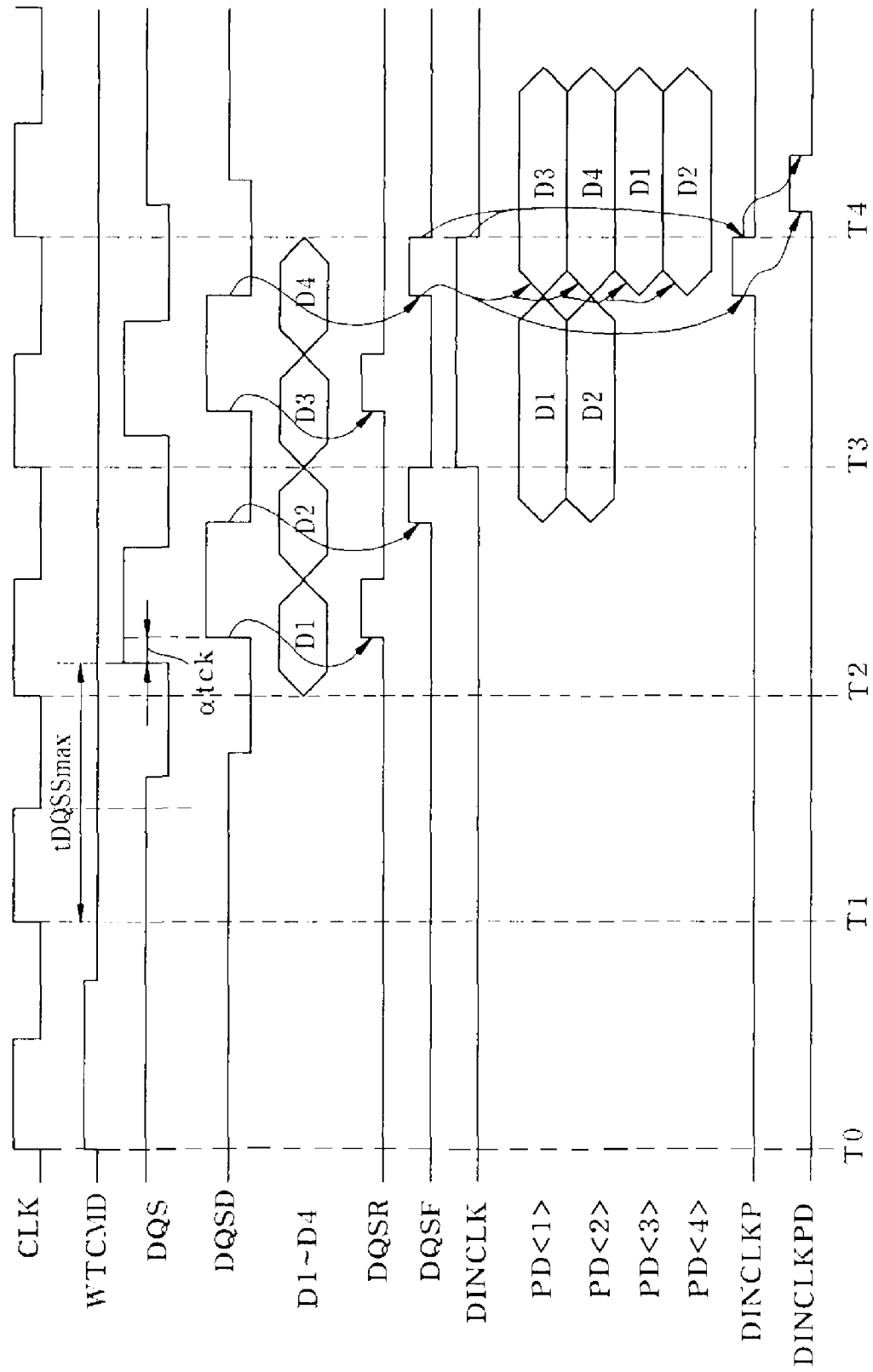
FIG. 11 is a timing diagram illustrating a case in which data are aligned when the data strobe signal inputted at the maximum input timing is delayed by αtCK due to internal environment factors.

FIG. 11 is a timing diagram illustrating a case in which data are aligned when the data strobe signal DQS inputted at the maximum input timing tDQSSmax plus a delay of αtCK due to internal environment factors. FIG. 12 is a timing diagram illustrating a case in which the data strobe signal DQS is inputted earlier than the minimum input timing tDQSSmin by αtCK due to external environment factors. For illustration purposes, it is assumed that a write latency is 1.

Referring to FIG. 11, when the write command WTCMD is inputted at time T0 of the clock CLK, the data strobe signal DQS is inputted within the maximum input timing tDQSSmax from time T1 of the clock CLK. However, as can be seen in FIG. 11, the data strobe signal DQS is delayed by αtCK due to internal environment factors. When the delayed data strobe signal DQSD is transferred to the buffer unit 11, the buffer unit 11 outputs the first alignment signal DQSR and the second alignment signal DQSF, and the data alignment unit 14: receives the data D1 to D4 according to the first alignment signal DQSR and the second alignment signal DQSF; parallelizes the data D1 to D4; and outputs the parallel data PD<1:4>. The parallel data PD<1:4> are outputted in response to the second rising timing of the second alignment signal DQSF.

Next, when the write command WTCMD is inputted at time T0, the duration signal generation unit 12 generates the duration signal DINCLK, which is enabled to a high level at time T3 (after 3tCK from time T0 of the clock CLK) and disabled to a low level at time T4. When the duration signal DINCLK is generated, the data input clock pulse generation unit 13 generates the initial data input clock pulse DINCLKP when the duration signal DINCLK becomes a high level in a duration in which the second alignment signal DQSF is enabled to a high level. Then, the data input clock pulse generation unit 13 delays the initial data input clock pulse DINCLKP and generates the data input clock pulse DINCLKPD. When the data input clock pulse DINCLKPD is generated, the driving unit 15 outputs the parallel data PD<1:4> as the global line data GIOD<1:4> in response to the data input clock pulse DINCLKPD. Since the timing in which the data D1 to D4 are aligned in parallel and the timing in which the data input clock pulse DINCLKPD is enabled are interworked with each other, the data input clock pulse DINCLKPD is enabled in such a state it ensures a sufficient margin with the parallel data PD<1:4>. Thus, the global line data GIOD<1:4> are stably outputted. That is, since the data input clock pulse DINCLKPD is enabled in response to the second rising timing of the second alignment signal DQSF in which the data D1 to D4 are finally parallelized, the global line data GIOD<1:4> can be outputted in such a state that a sufficient margin is ensured even though the parallelization timing of the data D1 to D4 is late due to internal environment factors.

Likewise, as can be seen from FIG. 12, the data input clock pulse DINCLKPD is enabled in such a state that it ensures a sufficient margin with the parallel data PD<1:4>, even though the data strobe signal DQS is inputted earlier than the minimum input timing tDQSSmin by αtCK due to external environment factors. Since the data input clock pulse DINCLKPD is enabled in response to the second rising timing of the second alignment signal DQSF at which the data D1 to D4 are finally parallelized, the global line data GIOD<1:4> can be outputted in such a state that a sufficient margin is ensured even though the parallelization timing of the data D1 to D4 is late due to internal environment factors.

As described above, the write driving device according to an embodiment of the present invention can stably transfer the data D1 to D4 to the global lines GIO even though the parallelization timing of the data D1 to D4 is varied due to the data strobe signal DQS.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A write driving comprising:
   a buffer unit configured to generate an alignment signal in response to level transitioning of a data strobe signal;
   a duration signal generation unit configured to generate a duration signal which is enabled for a predetermined duration in response to a write command; and
   a data input clock pulse generation unit configured to generate a data input clock pulse for transferring data to a global line in response to the alignment signal within the enabled duration of the duration signal.

2. The write driving device of claim 1, wherein the alignment signal is generated in response to a falling timing of the data strobe signal.

3. The write driving device of claim 1, wherein the buffer unit comprises a pulse generation section configured to generate the alignment signal being a pulse signal in response to a falling timing of the data strobe signal.

4. The write driving device of claim 1, wherein the duration signal is generated by shifting the write command in response to a clock and is enabled for 1tCK of the clock.

5. The write driving device of claim 1, wherein the duration signal generation unit comprises:
   a first flip-flop configured to receive the write command and operate in synchronization with a clock;
   a second flip-flop configured to receive an output signal of the first flip-flop and operate in synchronization with the clock; and
   a third flip-flop configured to receive an output signal of the second flip-flop and output the duration signal in synchronization with the clock.

6. The write driving device of claim 1, wherein the data input clock pulse generation unit comprises:
   a first cross-coupled latch section configured to generate a first pull-up signal for pulling up a first node and a first pull-down signal for pulling down the first node in response to a level of the duration signal within the enabled duration of the alignment signal;
   a first driving section configured to drive the first node in response to the first pull-up signal and the first pull-down signal;
   a third pulse generation section configured to generate an initial data input clock pulse in response to a signal of the first node; and
   a first delay section configured to delay the initial data input clock pulse and output the data input clock pulse.

7. The write driving device of claim 6, wherein the first driving section comprises:
   a first pull-up element configured to pull up the first node in response to the first pull-up signal; and
   a first pull-down element configured to pull down the first node in response to the first pull-down signal.

8. A write driving device comprising:
   a buffer unit configured to generate first and second alignment signals in response to level transitioning of a data strobe signal;
   a duration signal generation unit configured to generate a duration signal which is enabled for a predetermined duration in response to a write command;
   a data input clock pulse generation unit configured to generate a data input clock pulse in response to the second alignment signal within the enabled duration of the duration signal;
   a data alignment unit configured to receive serial data and convert the serial data to parallel data by parallelizing the received serial data according to the first and second alignment signals; and
   a driving unit configured to output the parallel data in response to the data input clock pulse.

9. The write driving device of claim 8, wherein the first alignment signal is generated in response to a rising timing of the data strobe signal, and the second alignment signal is generated in response to a falling timing of the data strobe signal.

10. The write driving device of claim 8, wherein the buffer unit comprises:
    a first pulse generation section configured to generate the first alignment signal in response to the rising timing of the data strobe signal; and
    a second pulse generation section configured to generate the second alignment signal in response to the falling timing of the data strobe signal.

11. The write driving device of claim 8, wherein the duration signal is generated by shifting the write command in response to a clock and is enabled for 1 tCK of the clock.

12. The write driving device of claim 8, wherein the duration signal generation unit comprises:
    a first flip-flop configured to receive the write command and operate in synchronization with a clock;
    a second flip-flop configured to receive an output signal of the first flip-flop and operate in synchronization with the clock; and
    a third flip-flop configured to receive an output signal of the second flip-flop and output the duration signal in synchronization with the clock.

13. The write driving device of claim 8, wherein the data input clock pulse generation unit comprises:
- a first cross-coupled latch section configured to generate a first pull-up signal for pulling up a first node and a first pull-down signal for pulling down the first node in response to a level of the duration signal in within the enabled duration of the second alignment signal;
- a first driving section configured to drive the first node in response to the first pull-up signal and the first pull-down signal;
- a third pulse generation section configured to generate an initial data input clock pulse in response to a signal of the first node; and
- a first delay section configured to delay the initial data input clock pulse and output the data input clock pulse.

14. The write driving device of claim 13, wherein the first driving section comprises:
- a first pull-up element configured to pull up the first node in response to the first pull-up signal; and
- a first pull-down element configured to pull down the first node in response to the first pull-down signal.

15. The write driving device of claim 8, wherein the driving unit comprises:
- a second cross-coupled latch section configured to be enabled in response to the data input clock pulse and generate a second pull-up signal for pulling up a second node and a second pull-down signal for pulling down the second node in response to a level of the parallel data in within the enabled duration of the second alignment signal; and
- a second driving section configured to output global line data by driving the second node in response to the second pull-up signal and the second pull-down signal.

16. The write driving device of claim 15, wherein the second driving section comprises:
- a second pull-up element configured to pull up the second node in response to the second pull-up signal; and
- a second pull-down element configured to pull down the second node in response to the second pull-down signal.

* * * * *